United States Patent
Lin et al.

(10) Patent No.: US 8,399,990 B2
(45) Date of Patent: *Mar. 19, 2013

(54) METHOD OF FORMING TOP ELECTRODE FOR CAPACITOR AND INTERCONNECTION IN INTEGRATED PASSIVE DEVICE (IPD)

(75) Inventors: Yaojian Lin, Singapore (SG); Robert C. Frye, Piscataway, NJ (US)

(73) Assignee: STATS ChipPAC, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/355,354

(22) Filed: Jan. 20, 2012

(65) Prior Publication Data

US 2012/0119329 A1 May 17, 2012

Related U.S. Application Data

(60) Continuation of application No. 12/763,386, filed on Apr. 20, 2010, now Pat. No. 8,120,183, which is a division of application No. 11/689,319, filed on Mar. 21, 2007, now Pat. No. 7,727,879.

(51) Int. Cl.
*H01L 23/48* (2006.01)

(52) U.S. Cl. ............... 257/758; 257/750; 257/E23.142; 257/E23.145

(58) Field of Classification Search .............. 257/750, 257/758, E23.142, E23.145
See application file for complete search history.

(56) References Cited

U.S. PATENT DOCUMENTS

| | | |
|---|---|---|
| 5,370,766 A | 12/1994 | Desaigoudar et al. |
| 5,446,311 A | 8/1995 | Ewen et al. |
| 5,478,773 A | 12/1995 | Dow et al. |
| 6,075,427 A | 6/2000 | Tai et al. |
| 2003/0109128 A1 | 6/2003 | Koganei |
| 2003/0148558 A1 | 8/2003 | Kubo et al. |
| 2007/0057343 A1* | 3/2007 | Chinthakindi et al. ........ 257/532 |
| 2007/0170546 A1* | 7/2007 | Beach ........................... 257/532 |

* cited by examiner

*Primary Examiner* — Julia Slutsker
(74) *Attorney, Agent, or Firm* — Robert D. Atkins; Patent Law Group: Atkins & Associates, P.C.

(57) ABSTRACT

A method of manufacturing a semiconductor device includes providing a substrate having a first conductive layer disposed on a top surface of the substrate. A high resistivity layer is formed over the substrate and the first conductive layer. A dielectric layer is deposited over the substrate, first conductive layer and high resistivity layer. A portion of the dielectric layer, high resistivity layer, and first conductive layer forms a capacitor stack. A first passivation layer is formed over the dielectric layer. A second conductive layer is formed over the capacitor stack and a portion of the first passivation layer. A first opening is etched in the dielectric layer to expose a surface of the high resistivity layer. A third and fourth conductive layer is deposited over the first opening in the dielectric layer and a portion of the first passivation layer.

30 Claims, 14 Drawing Sheets

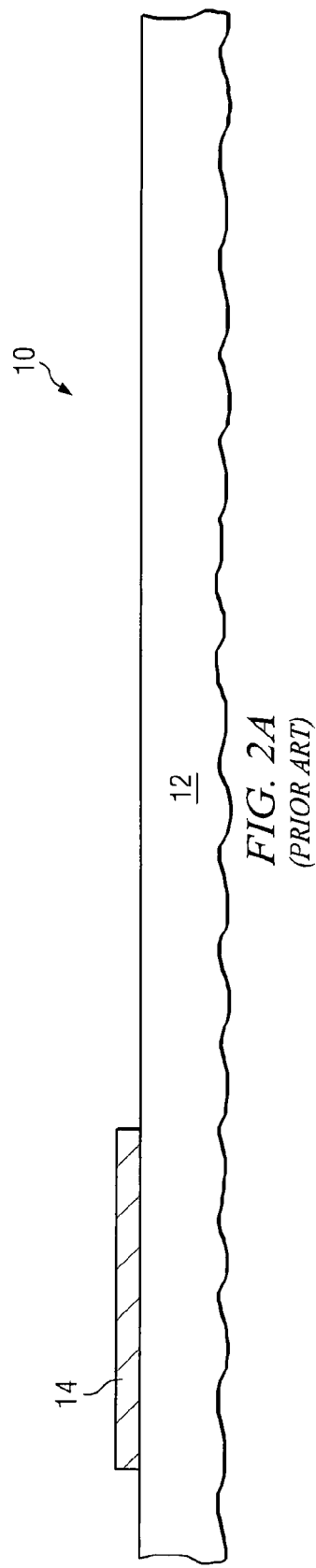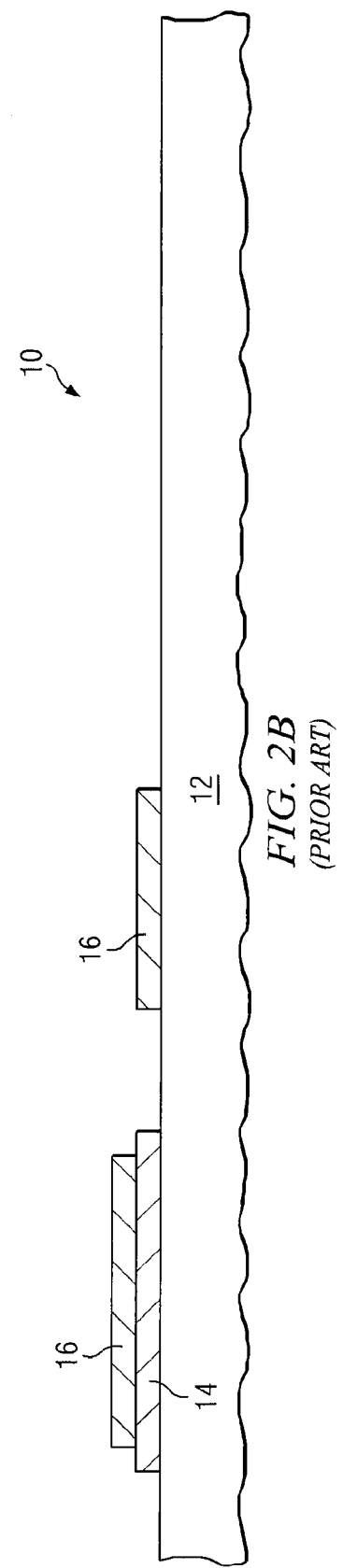
FIG. 2A (PRIOR ART)
FIG. 2B (PRIOR ART)

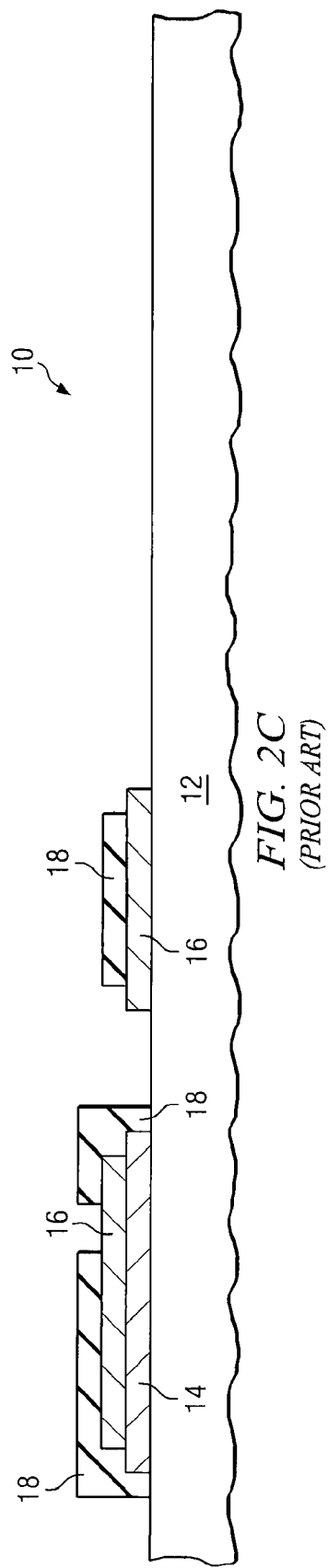
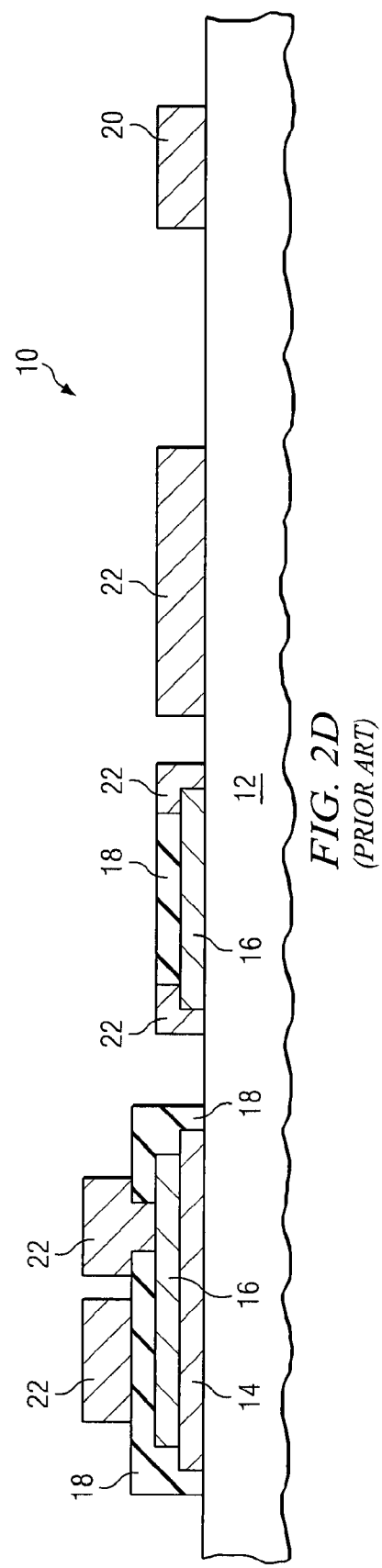
FIG. 2C (PRIOR ART)
FIG. 2D (PRIOR ART)

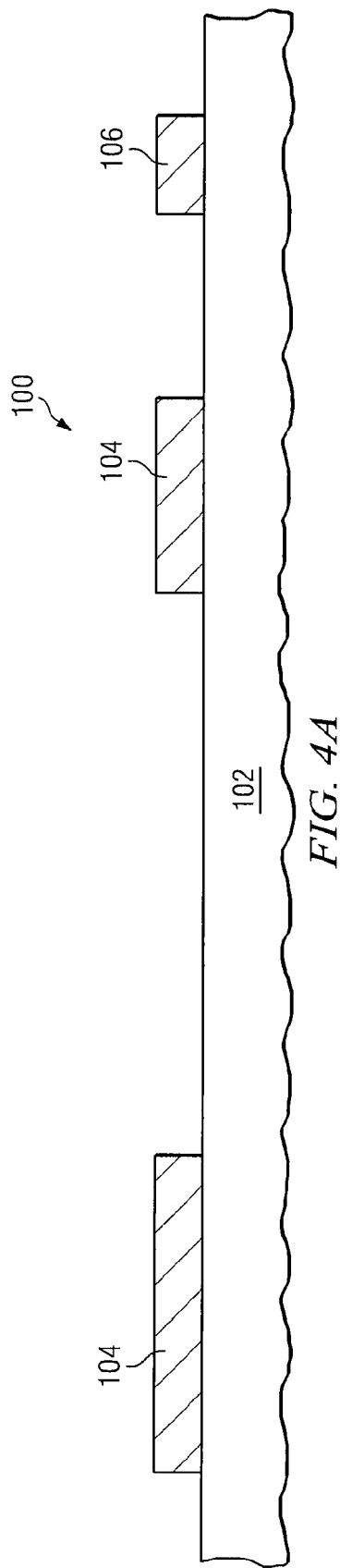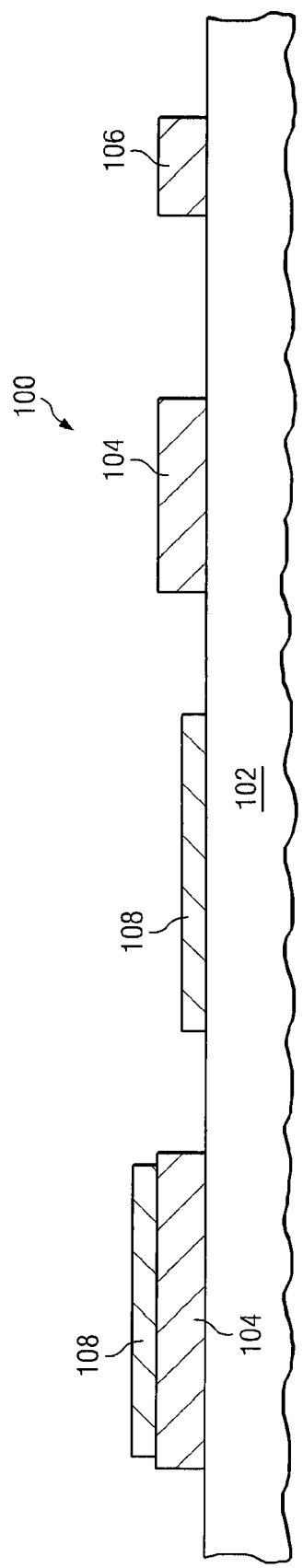

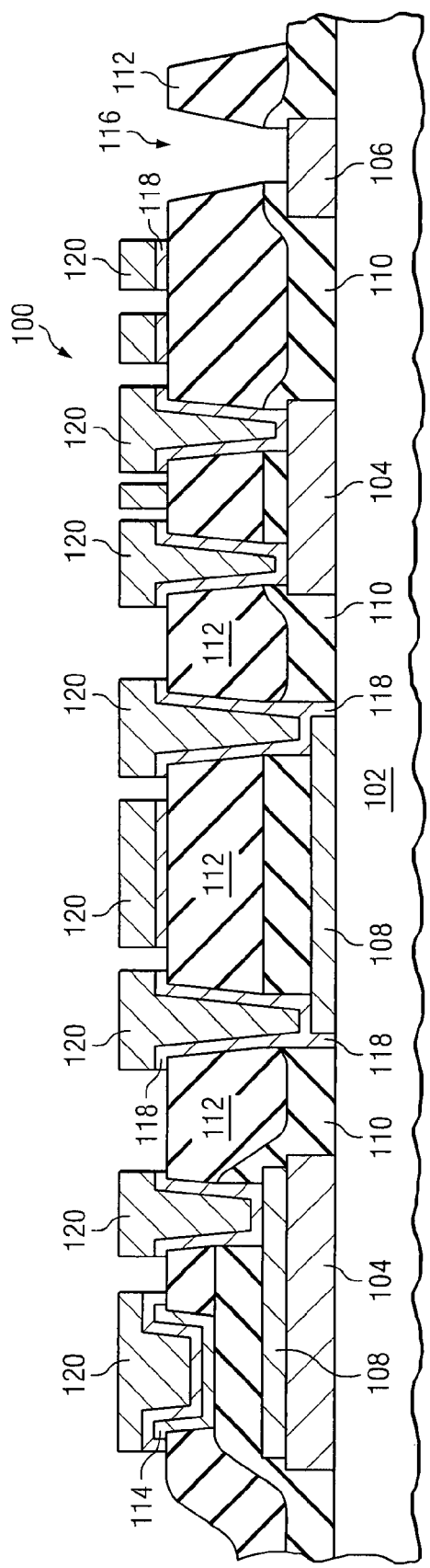
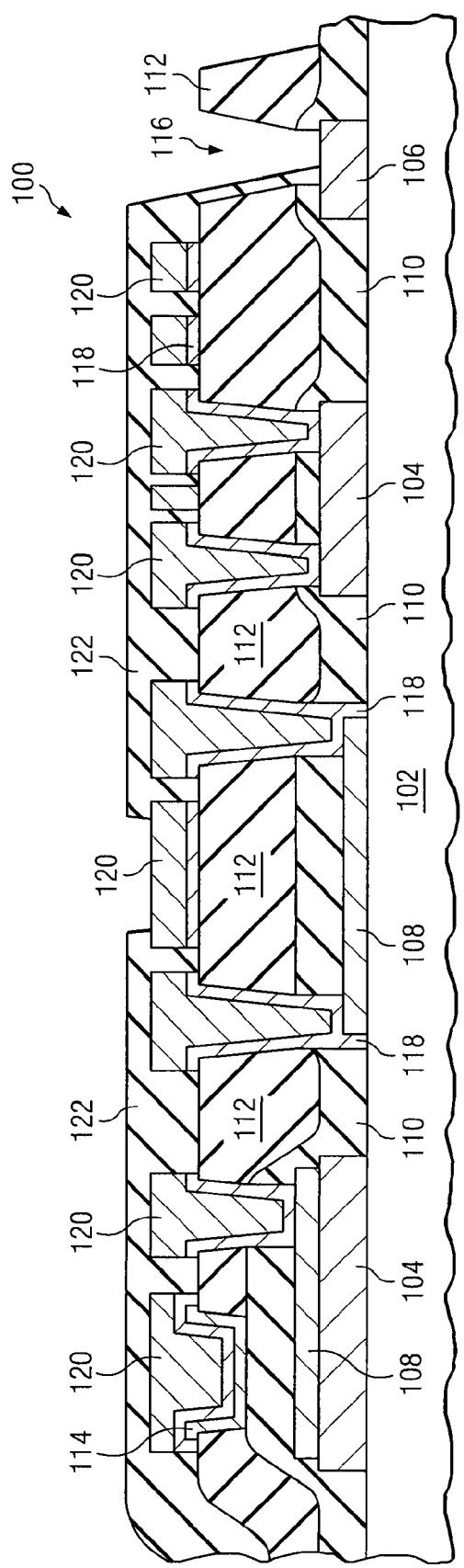
FIG. 4G
FIG. 4H

METHOD OF FORMING TOP ELECTRODE FOR CAPACITOR AND INTERCONNECTION IN INTEGRATED PASSIVE DEVICE (IPD)

CLAIM TO DOMESTIC PRIORITY

The present application is a continuation of U.S. patent application Ser. No. 12/763,386, filed Apr. 20, 2010, now U.S. Pat. No. 8,120,183, which is a division of U.S. application Ser. No. 11/689,319, filed Mar. 21, 2007, now U.S. Pat. No. 7,727,879.

FIELD OF THE INVENTION

The present invention relates in general to semiconductor devices and, more particularly, to an apparatus and method of fabricating a capacitor device and interconnection structures in an integrated passive device (IPD).

BACKGROUND OF THE INVENTION

Semiconductors, or computer chips, are found in virtually every electrical product manufactured today. Chips are used not only in very sophisticated industrial and commercial electronic equipment, but also in many household and consumer items such as televisions, clothes washers and dryers, radios, and telephones. As products become smaller but more functional, there is a need to include more chips in the smaller products to perform the functionality. The reduction in size of cellular telephones is one example of how more and more capabilities are incorporated into smaller and smaller electronic products.

As electrical devices become increasingly miniaturized, technologies have combined integrated circuit (IC) manufacturing techniques with traditional electrical circuit components to form such components as capacitors, resistors, filters, and interconnects directly upon a silicon or silicon-like substrate. For example, most of the devices in today's portable wireless products are passive components, and the integration of passive components into a substrate or a separate device can provide significant performance, cost, and size advantages.

A typical such semiconductor device 10 having an integrated capacitor device is shown in FIG. 1. A process for fabricating device 10 is depicted in FIGS. 2A-2I. Device 10 includes a substrate 12 and a first conductive layer 14 disposed over the substrate (FIG. 2A). A high resistivity layer 16 is disposed over a portion of the substrate 12 and first conductive layer 14 as shown (FIG. 2B). A dielectric layer 18 is disposed over the high resistivity layers (FIG. 2C).

As a next step, a second conductive layer 22 is formed over the dielectric layer 18. A wire bond (WB) pad 20 is formed on the substrate (FIG. 2D). A first passivation layer 24 is formed as shown (FIG. 2E). A third and fourth conductive layer 26 and 28 are then disposed over the passivation layer 24 as shown (FIG. 2F). A second passivation layer 30 is then formed over the layers 26 and 28 (FIG. 2G). Fifth and sixth conductive layers 32 and 34 are formed (FIG. 2H). A solder bump 36 is then deposited on the layer 34 (FIG. 2I).

In the depicted process, the second conductive layer 22 is used as a top electrode of the capacitor device, which is patterned before the deposition of the first passivation layer 24. A wet etching process is used for patterning the layer 22. The wet etching process is generally not uniform, making critical dimension (CD) control a potentially serious manufacturing issue when patterning layer 22.

As a result, a lack of uniformity and potential over/under etching will effect the capacitance characteristics of the capacitor device, resulting in non-uniform specifications of the capacitor device. The center frequency of a filter having such a capacitor device is necessarily affected.

SUMMARY OF THE INVENTION

A need exists for a method of forming a semiconductor device having an integrated capacitor device with better controlled capacitance and corresponding increased uniformity and repeatability. In addition, a need exists for manufacturing techniques for the semiconductor device as described which reduce process steps, resulting in shorter cycle time and lower cost.

In one embodiment, the present invention is a method of manufacturing a semiconductor device comprising the steps of providing a substrate, forming a first insulating layer over the substrate, forming a second insulating layer on the first insulating layer, and forming a first opening through the second insulating layer. The method further includes the steps of conformally applying a first conductive layer within the first opening and forming a second opening through the second insulating layer, and removing a portion of the first insulating layer through the second opening. The second opening is separate from the first opening.

In another embodiment, the present invention is a method of manufacturing a semiconductor device comprising the steps of providing a substrate, forming a first insulating layer over the substrate, and forming a second insulating layer on the first insulating layer. The method further includes the steps of forming an opening through the second insulating layer and removing a portion of the first insulating layer through the opening.

In another embodiment, the present invention is a method of manufacturing a semiconductor device comprising the steps of providing a substrate, forming a first insulating layer over the substrate, forming a second insulating layer over the first insulating layer, and forming an opening through the second insulating layer to expose a surface of the first insulating layer.

In another embodiment, the present invention is a semiconductor device comprising a substrate, a first insulating layer disposed over the substrate, a second insulating layer disposed on the first insulating layer, and a first opening through the second insulating layer. The first opening exposes a surface of the first insulating layer. The semiconductor device further includes a second opening through the first and second insulating layers and a first conductive layer conformally disposed within the first and second openings. The second opening is separate from the first opening.

BRIEF DESCRIPTION OF THE DRAWINGS

FIG. 2A illustrates a first step in an example prior art method of manufacturing an embodiment of a semiconductor device;

FIG. 2B illustrates a second step in the prior art method of manufacturing began with FIG. 2A;

FIG. 2C illustrates a third step in the prior art method of manufacturing began with FIG. 2A;

FIG. 2D illustrates a fourth step in the prior art method of manufacturing began with FIG. 2A;

FIG. 4A illustrates a first step in an example method of manufacturing a semiconductor device;

FIG. 4B illustrates a second step in an example method of manufacturing a semiconductor device;

FIG. 4G illustrates a seventh step in an example method of manufacturing a semiconductor device;

FIG. 4H illustrates an eighth step in an example method of manufacturing a semiconductor device;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

A semiconductor device having an integrated passive capacitor device can be manufactured which serves to alleviate the problem of non-uniformity in dimension, and better controlled capacitance, resulting in overall higher repeatability. Moreover, the semiconductor device can be manufactured using less process steps, which contributes to shorter cycle time and lower overall cost. In addition, a lithography step is eliminated in the manufacturing process, which reduces overall cost even further.

Passive devices such as a capacitor device, which will be further described in detail, can be combined with other passive devices, such as resistors, transceivers, receivers, BALUNs, and filter devices to constitute the semiconductor device. In one embodiment, a capacitor device can be interconnected with an inductor device as will be later described. A variety of passive components can be interconnected, however, to suit a particular application.

Figure 1:
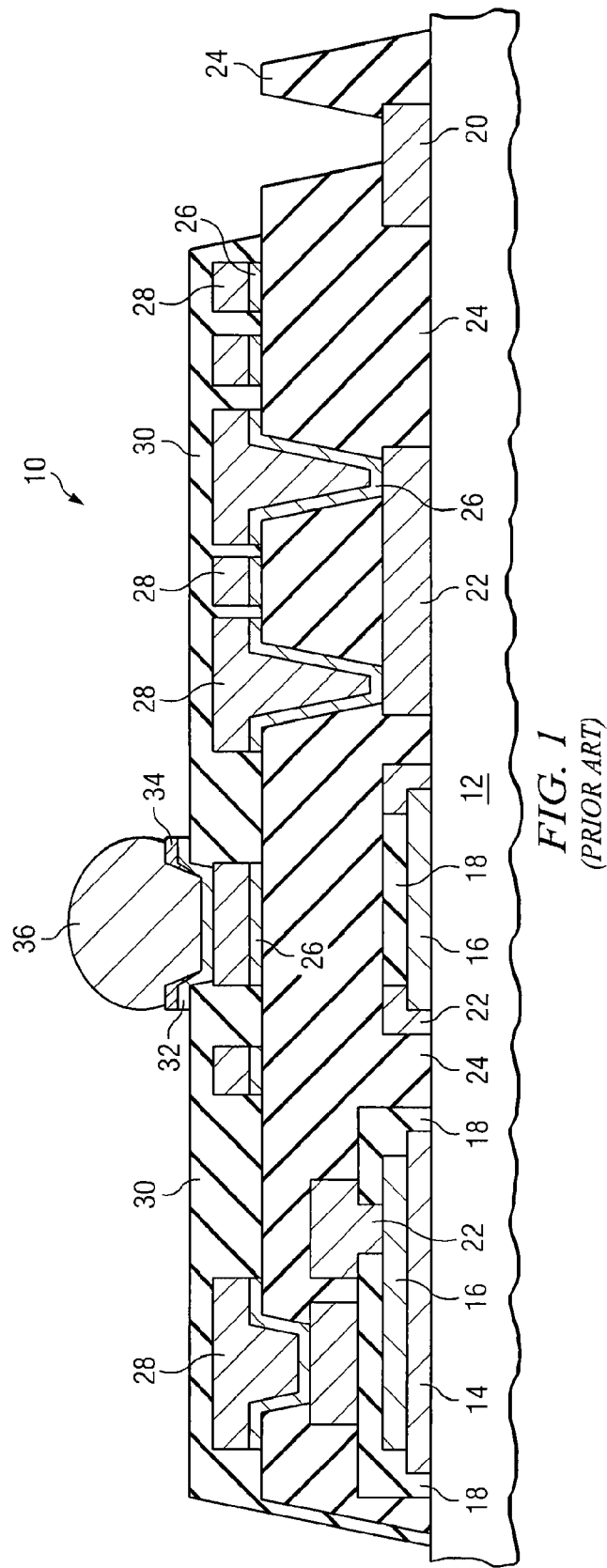
FIG. 1 illustrates an example prior art semiconductor device.
Figure 2E:
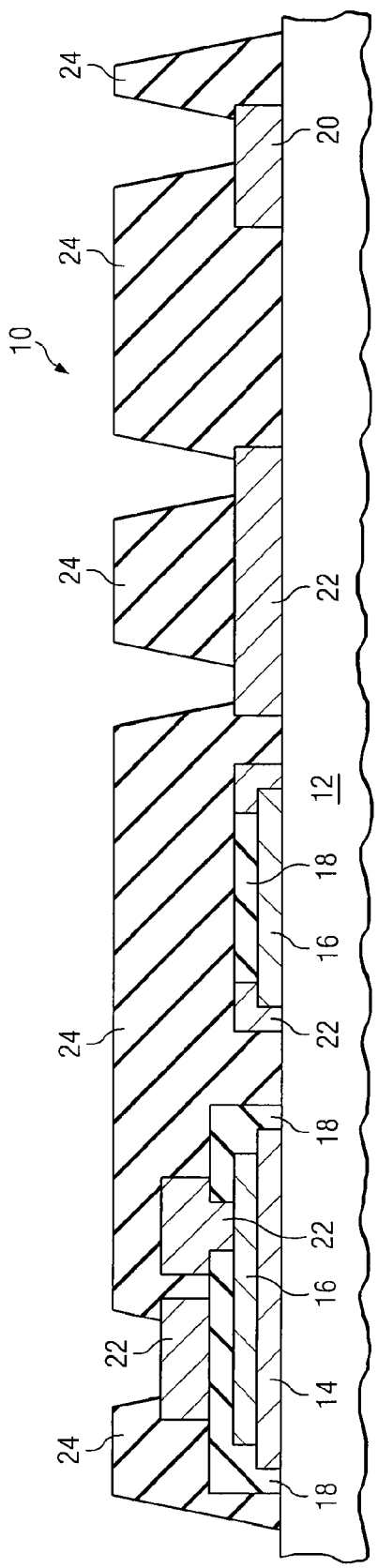
FIG. 2E illustrates a fifth step in the prior art method of manufacturing began with FIG. 2A.
Figure 2F:
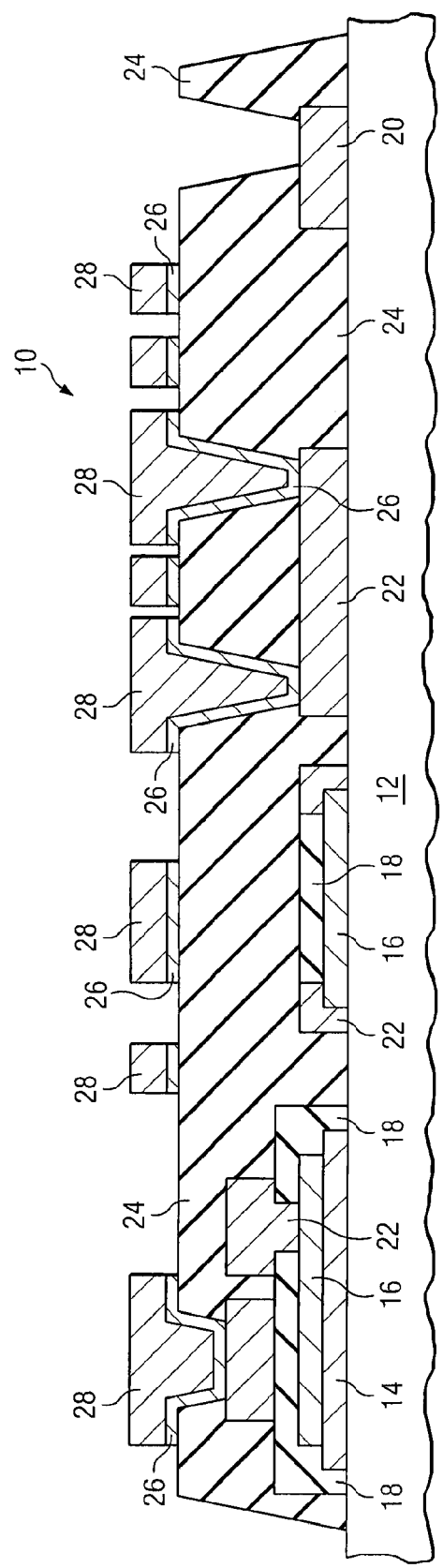
FIG. 2F illustrates a sixth step in the prior art method of manufacturing began with FIG. 2A.
Figure 2G:
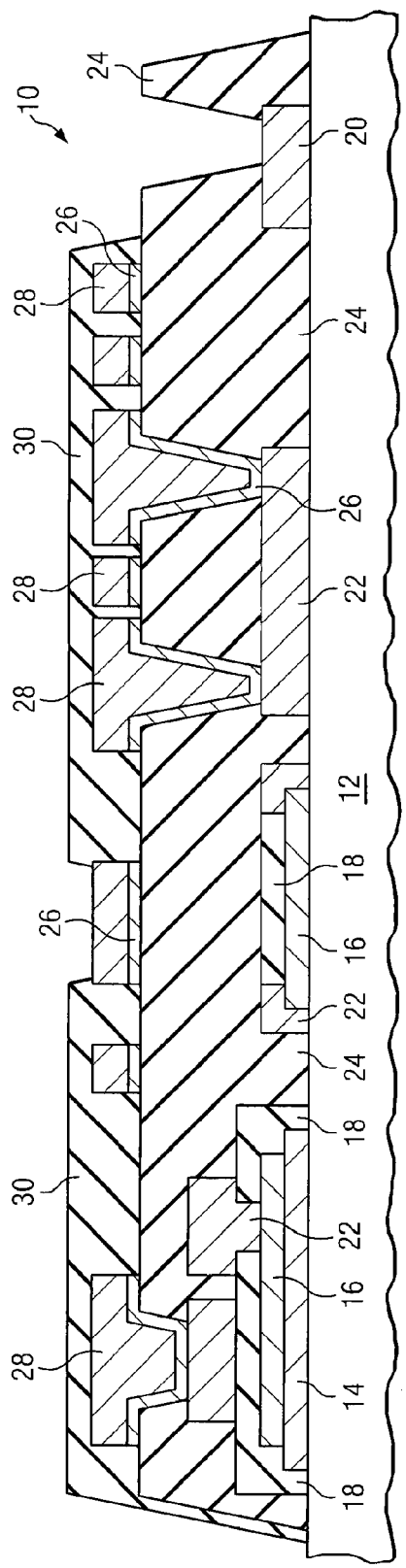
FIG. 2G illustrates a seventh step in the prior art method of manufacturing began with FIG. 2A.
Figure 2H:
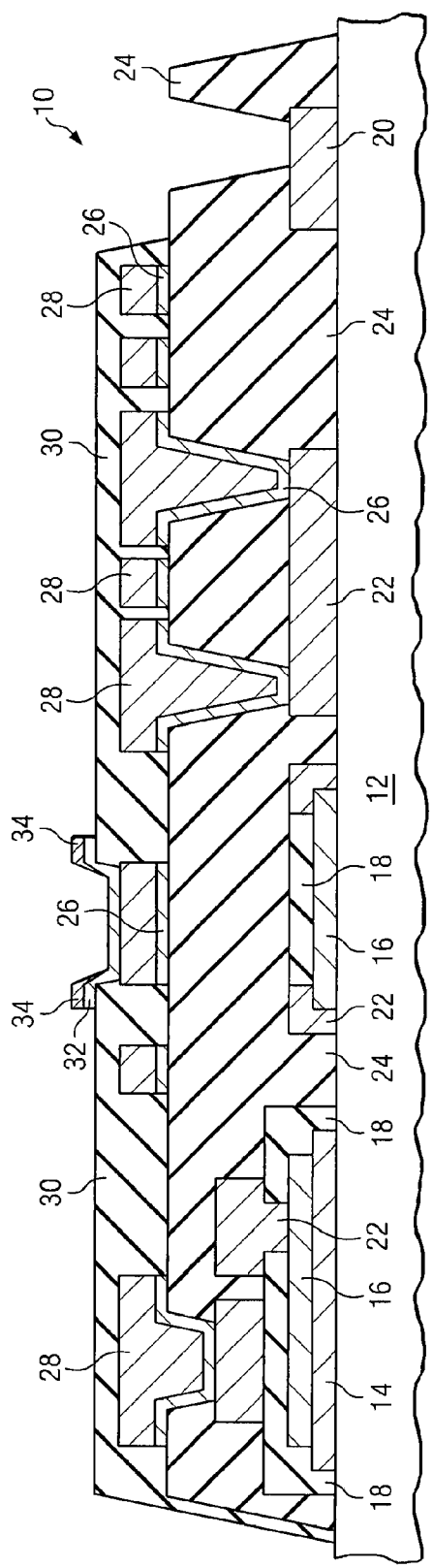
FIG. 2H illustrates an eighth step in the prior art method of manufacturing began with FIG. 2A.
Figure 2I:
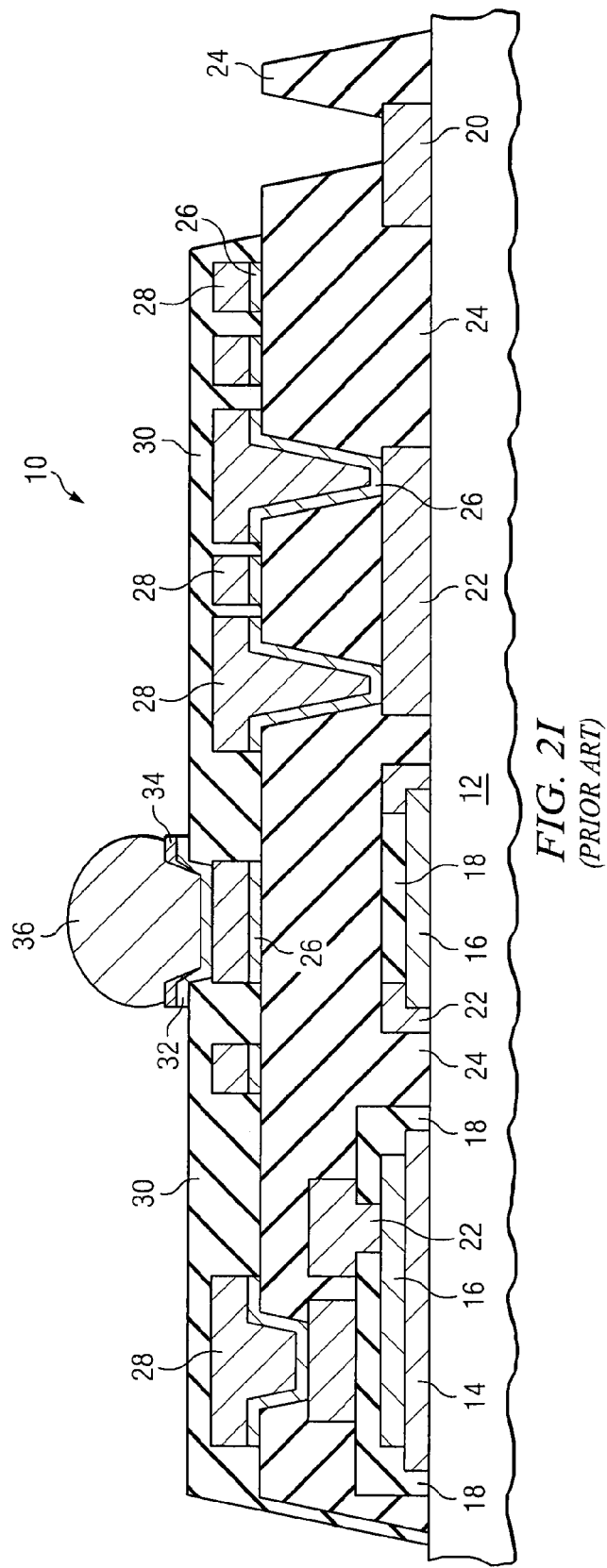
FIG. 2I illustrates a final, ninth step in the prior art method of manufacturing began with FIG. 2A.
Figure 3:
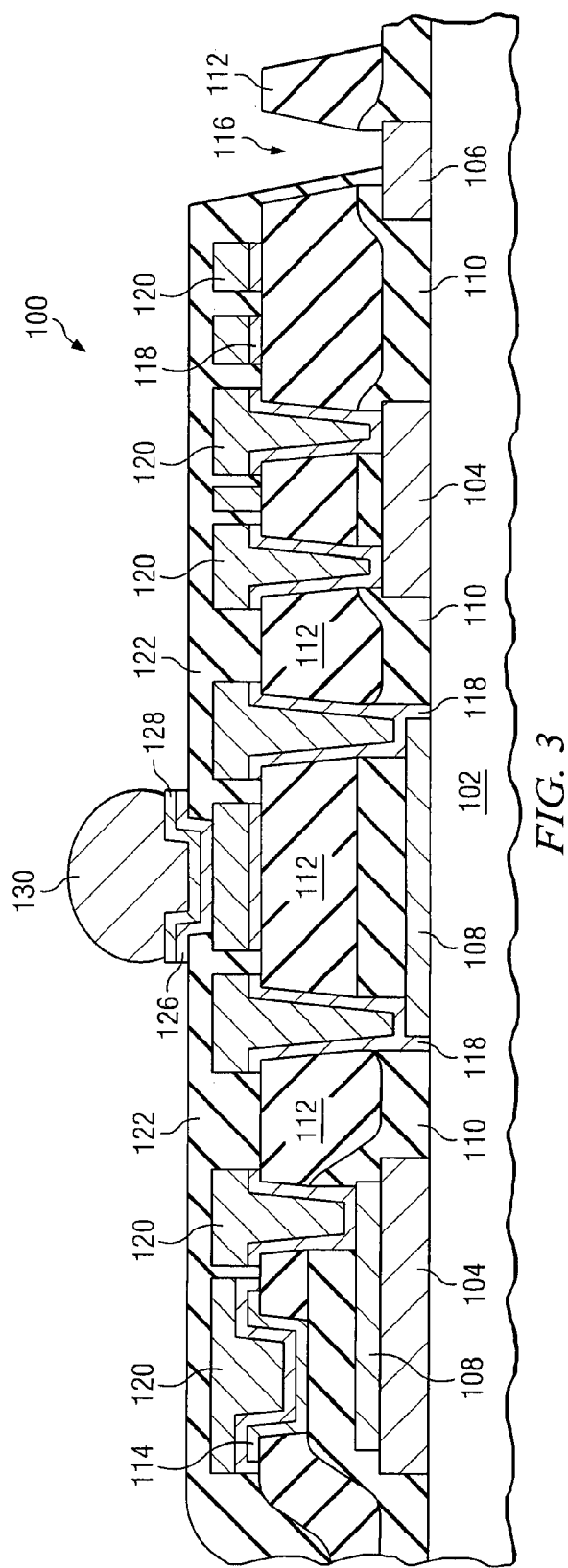
FIG. 3 illustrates an example first embodiment of a semiconductor device.

Turning to FIG. 3, a semiconductor device 100 manufactured according to various aspects of the present invention is illustrated. Device 100 includes a substrate 102, over which a first conductive layer 104 is disposed. A WB pad 106 is also optionally disposed over the substrate 102 as shown. A high resistivity layer 108 is disposed above the first conductive layer 104 and a portion of the center of the substrate 102 as shown. A dielectric layer 110 is formed above the high resistivity layer 108. A first passivation layer 112 is disposed above the dielectric layer.

In a departure from the prior art, a thin, second conductive layer 114 is deposited and patterned after the passivation layer 112 has been formed. Layer 114 serves as a top electrode of a capacitor device. A third and fourth conductive layer 118, 120 are formed over the electrode 114. A second passivation layer 122 is formed over the foregoing components. An opening is maintained to expose the fourth conductive layer for electrical connectivity. In one embodiment, the dielectric layer 110 above the WB pad 106 is etched to expose a surface 124 of the WB pad for electrical connectivity. Fifth and sixth conductive layers 126 and 128 are disposed above the opening. Finally, a bump 130 is connected to the layer 128.

Semiconductor device 100 has several features which innovate over the prior art device 10, including the patterning of a thin conductive layer 114 after the deposition of the first passivation layer 112. In addition, the dielectric layer 110 can be patterned with the first passivation layer as a hard mask. This patterning can occur after the second conductive layer 114 is deposited, which cuts out a fabrication step and lowers cost. A dimension of the top capacitor electrode 114 can be defined by the design and/or lithography of the thin first passivation layer 112. By using the passivation layer 112, the top electrode 114 is prevented from being over-etched. The patterning of the first passivation layer 112 is generally better controlled than the second conductive layer 114 patterning with prior art wet etching as only lithography is involved to define the size of the top electrode 114.

The respective lithography of the dielectric layer 110 having positive resist can be removed after using the first passivation layer 112 as the hard mask, which saves fabrication cost. In addition, conductive layer 114 can be made optional if tolerances of capacitances are not limited for a particular application.

Turning to FIG. 4A a first step in an example method of manufacturing a semiconductor device 100 is depicted in accordance with the present invention. A substrate 102 is provided. A first conductive layer 104 is deposited and patterned. The materials used in the layer 104 can include aluminum (Al), aluminum alloys, copper (Cu), gold (Au), silicide and polysilicon materials. An optional WB pad 106 is also disposed over the substrate 102.

FIG. 4B shows the deposition and patterning of a high resistivity layer 108, which is disposed over the layer 104 and a portion of the substrate 102 as shown. The high resistivity layer can be nickel-chromium (Ni—Cr), polysilicon, and other materials having a high resistance.

Figure 4C:
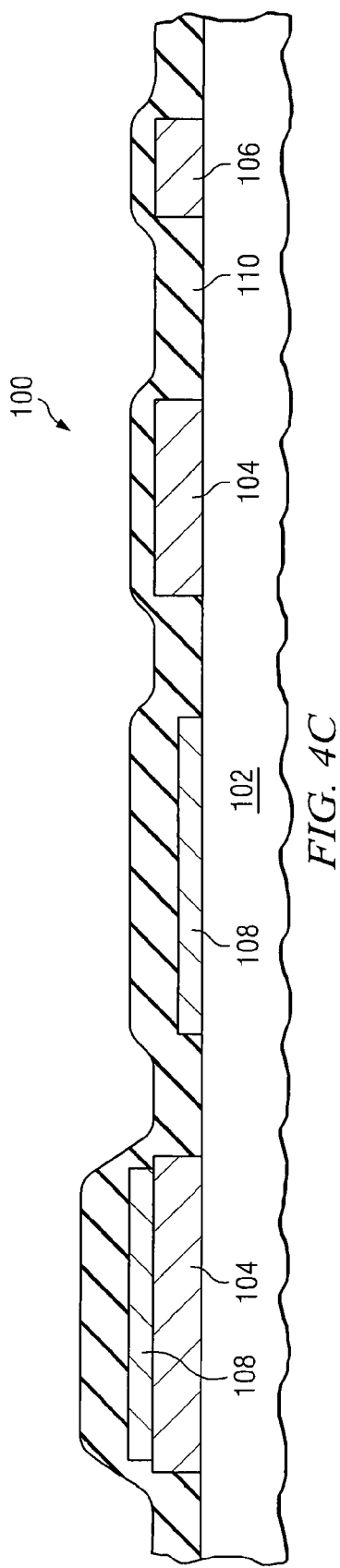
FIG. 4C illustrates a third step in an example method of manufacturing a semiconductor device.

FIG. 4C illustrates the deposition of a dielectric layer 110 over the high resistivity layer 108, conductive layer 104, and substrate 102 as shown. The dielectric layer can be composed of such materials as silicon nitride (SiN), tantalum oxide ($Ta_2O_5$), hafnium oxide ($HfO_2$), or a dielectric film material. The dielectric layer 110, high resistivity layer 108, and conductive layer 104 form various subcomponents of a capacitor stack.

Figure 4D:
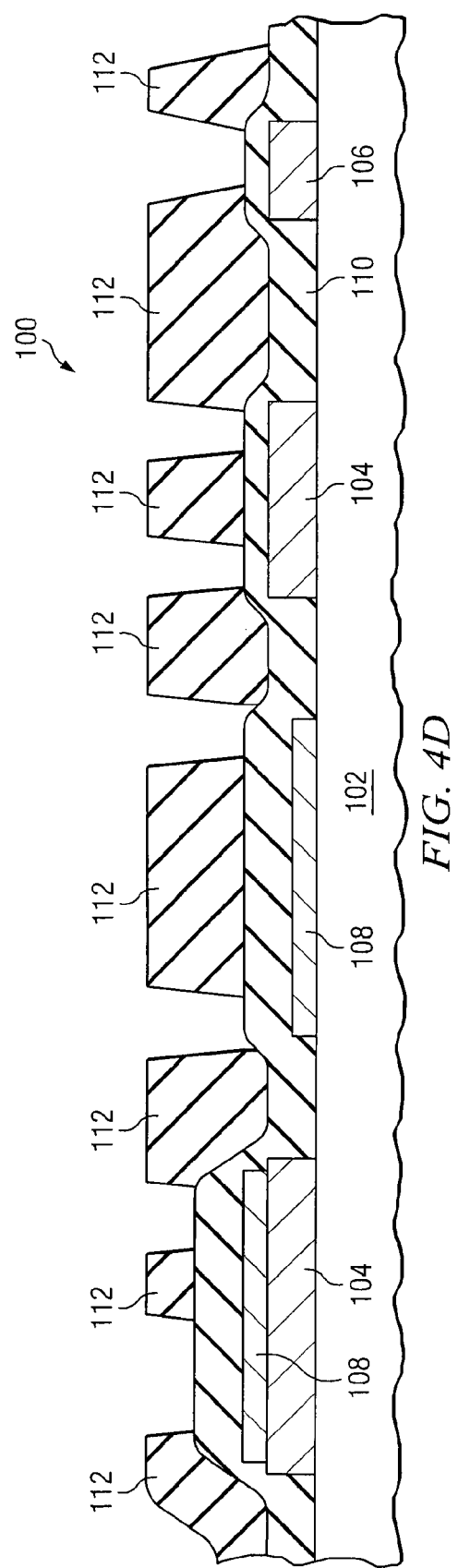
FIG. 4D illustrates a fourth step in an example method of manufacturing a semiconductor device.

FIG. 4D illustrates the forming of a first passivation layer 112 which is patterned and formed as shown over the layer 110. The passivation layer 112 can include an insulation material including polyimide, benzocyclobutene (BCB), or lead oxide (PbO).

Figure 4E:
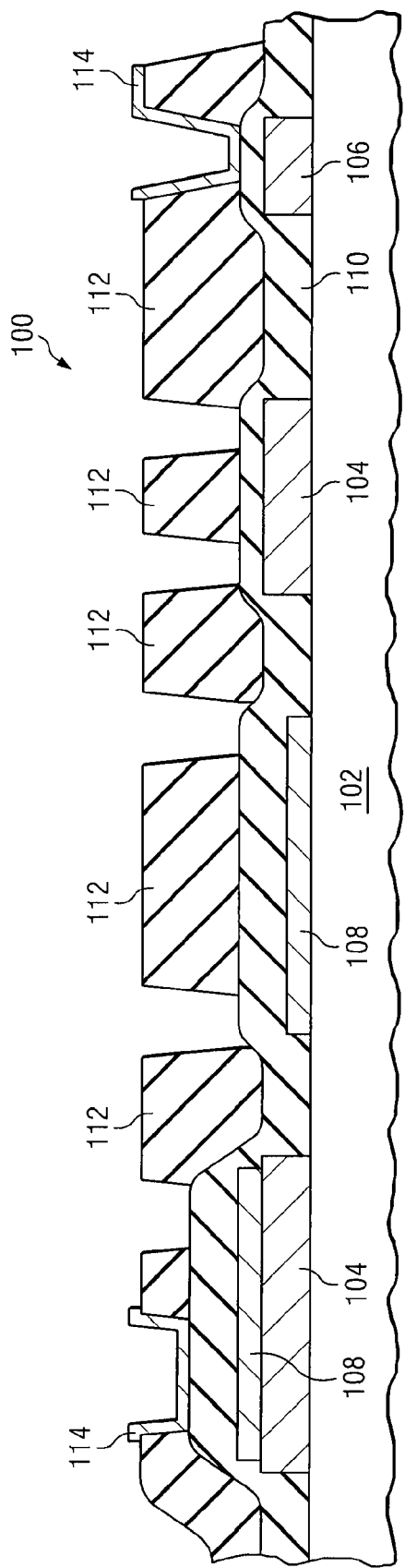
FIG. 4E illustrates a fifth step in an example method of manufacturing a semiconductor device.

FIG. 4E illustrates the deposition and patterning of a thin, second conductive layer 114 which is deposited over the capacitor stack as shown. Again, the deposition of layer 114 occurs after the patterning and deposition of the passivation layer 112. The patterning of layer 114 over the depicted WB pad 106 is optional. Materials such as aluminum (Al) and aluminum alloys can be used. Layer 114 becomes the top electrode of a capacitor device integrated into device 100.

Figure 4F:
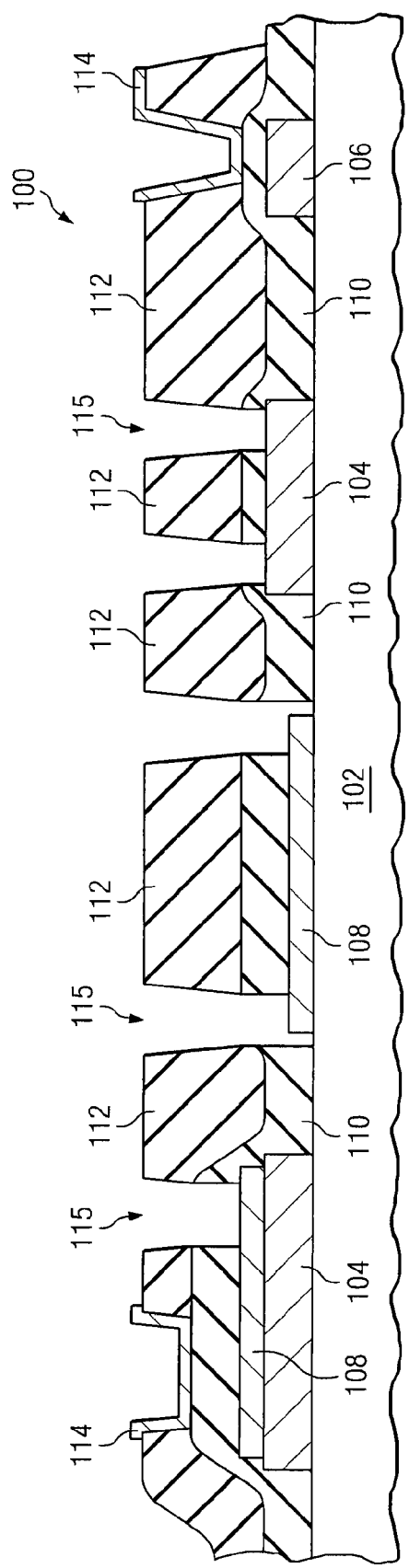
FIG. 4F illustrates a sixth step in an example method of manufacturing a semiconductor device.

The first passivation layer 112 is then used as the hard mask to etch the dielectric layer 110 as shown in FIG. 4F, which saves in production costs and fabrication steps.

FIG. 4G illustrates the deposition and patterning of a third and fourth conductive layer 118 and 120 which are formed over the layer 114 and elsewhere as depicted. The layer 118 can include such materials as titanium (Ti), titanium tungsten (TiW), chromium (Cr), tantalum (Ta), and tantalum nitride (TaN). The layer 120 can include such materials as aluminum (AL), aluminum alloy, copper (Cu), and gold (Au). An opening 116 exposes a surface of the dielectric layer 110 as shown.

FIG. 4H illustrates the deposition and patterning of a second passivation layer 122. Again, the passivation layer can include an insulation material including polyimide, benzocyclobutene (BCB), or lead oxide (PbO). Layer 122 can terminate on the first passivation layer 112 or the layer 122 can terminate on the WB pad 106. An opening is formed in the passivation layer 122 to expose a surface of the conductive layer 120 and provide electrical connectivity.

Figure 4I:
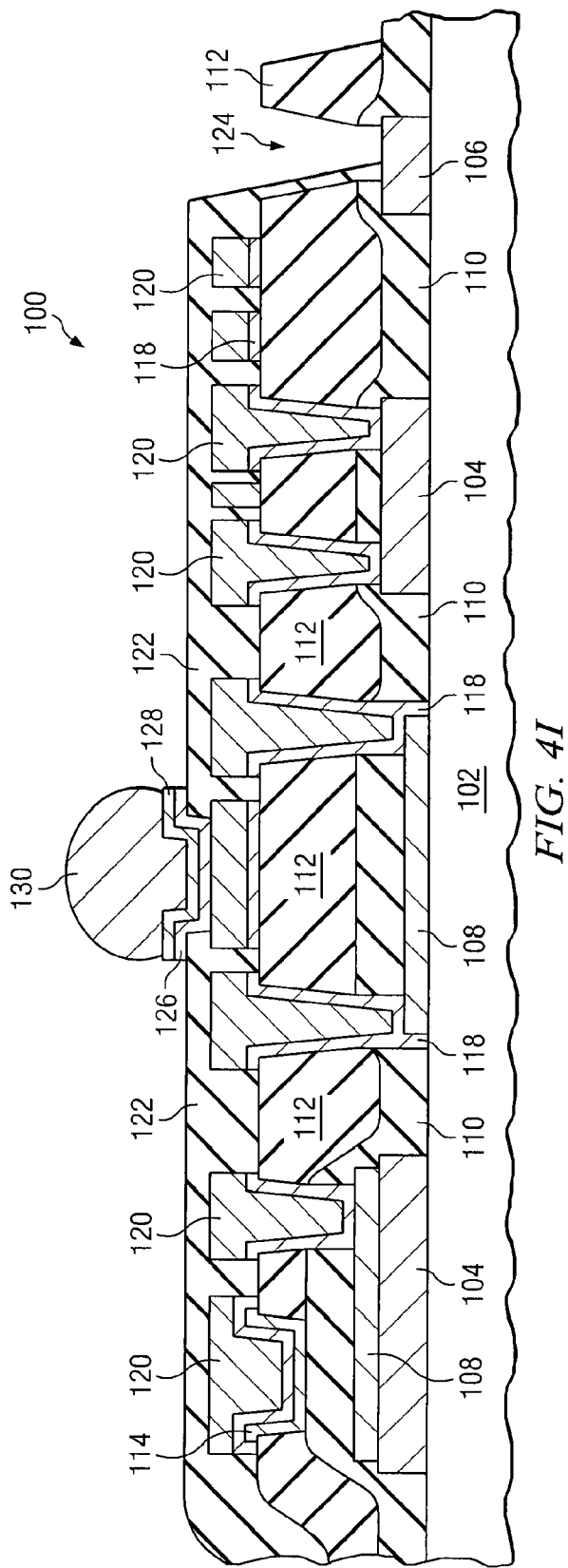
FIG. 4I illustrates a final, ninth step in an example method of manufacturing a semiconductor device.

Dielectric layer 110 over the WB pad 106 can be etched after completing the second passivation layer 122 to expose a surface of the WB pad 106 via opening 124 to suit a particular application as shown in FIG. 4I. As a next step, fifth and sixth conductive layers 126 and 128 are deposited over the opening 123 to provide electrical connectivity. The fifth conductive layer 126 can include such materials as titanium (Ti), titanium tungsten (TiW), aluminum (Al), aluminum alloy, and chromium (Cr). The sixth conductive layer 128 can include such materials as copper, copper/nickel vanadate (cu/NiV), gold/nickel (Au/Ni), and chromium/copper/copper (CrCu/Cu).

A bump 130, which can include a solder bump, gold (Au) bump, or copper (Cu) pillar structures is then formed over the layer 128 as shown. In one embodiment, the WB pad 106 can be protected during solder reflow, flux stripping, or other chemical processes.

Figure 5A:
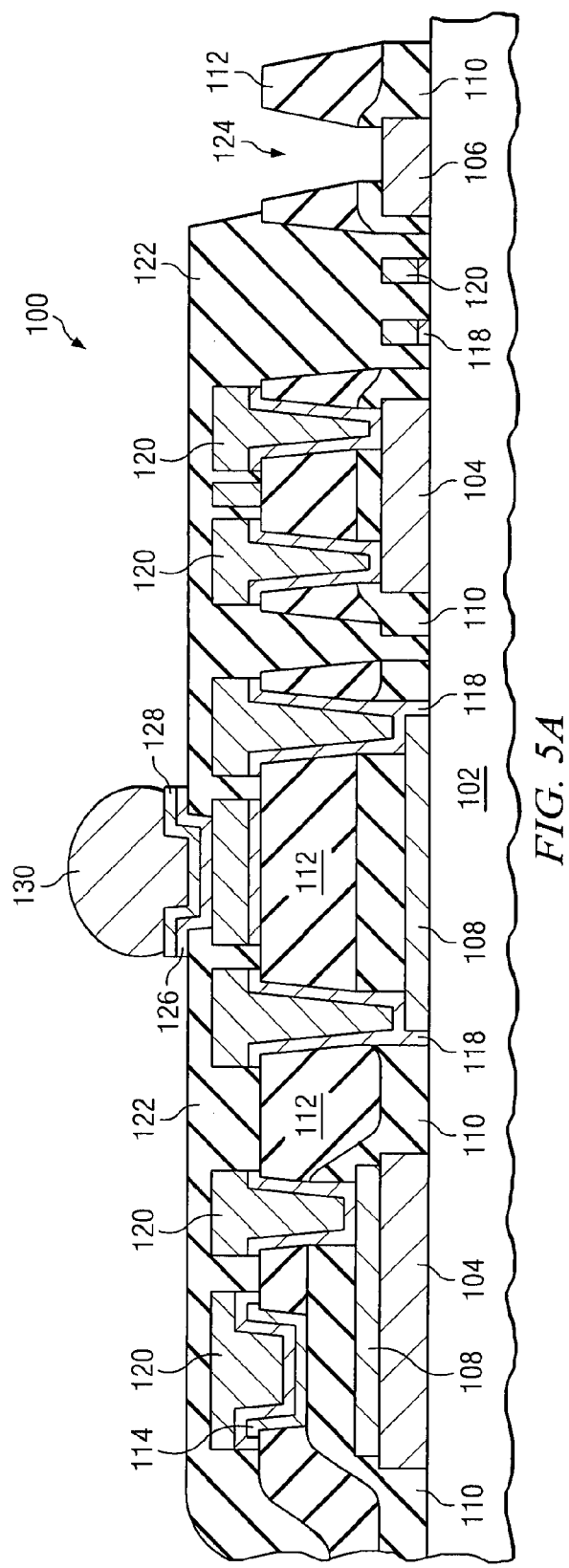
FIG. 5A illustrates an example second embodiment of a semiconductor device.

Turning to FIG. 5A, a second embodiment of a semiconductor device 100 is shown. Device 100 again includes a substrate 102. A first metal layer 104 is disposed over the substrate 102. The first metal layer can include an aluminum-copper (AlCu) material.

A WB pad 106 is disposed above the substrate as shown. A high resistivity layer 108 is disposed above a portion of the substrate 102 and metal layer 104. The layer 108 can include a tantalum silicide (TaSi) material. A dielectric layer 110 is disposed above the layers 108, 106, and 104. The dielectric layer can include a silicon nitride ($Si_3N_4$) material.

A first passivation layer 112 such as a polyimide material is deposed as shown. The layer 112 is patterned to leave an opening to expose a surface of the dielectric layer 110 in order to receive a thin, second metal layer 114 is shown. Again, layer 114 is deposited over a capacitor stack. Layer 114 can include an aluminum-copper (Al—Cu) material. Again, in a departure from the prior art, the layer 114 is deposited and patterned after the polyimide layer 112 is cured. Layer 114 serves as the top electrode of the capacitor device and is only patterned on the capacitor top plate, accordingly. Layer 114 is used partially to avoid any ion milling on the deposited dielectric layer 110.

Again, in a departure from the prior art, the dielectric layer 110 is patterned with the polyimide layer 112 as a hard mask after the second metal layer 114 is patterned. Such an approach again serves to eliminate a fabrication step and provides efficiency in manufacturing.

A third metal layer 118 and a fourth metal layer 120 are deposited. In one embodiment, titanium (Ti) can be incorporated into the layer 118 and copper (Cu) can be incorporated into the layer 120. A second polyimide layer 122 is formed as shown, leaving an opening to receive fifth and sixth conductive layers 126 and 128. Layer 126 can be composed of a titanium (Ti) material. Layer 128 can be composed of a nickel vanadium (NiV)/copper (Cu) material, respectively.

Layer 110 can be again etched to leave an opening 124 to expose a surface of the WB pad 106. A bump 130 is formed over layer 128 as shown to provide electrical connectivity.

Figure 5B:
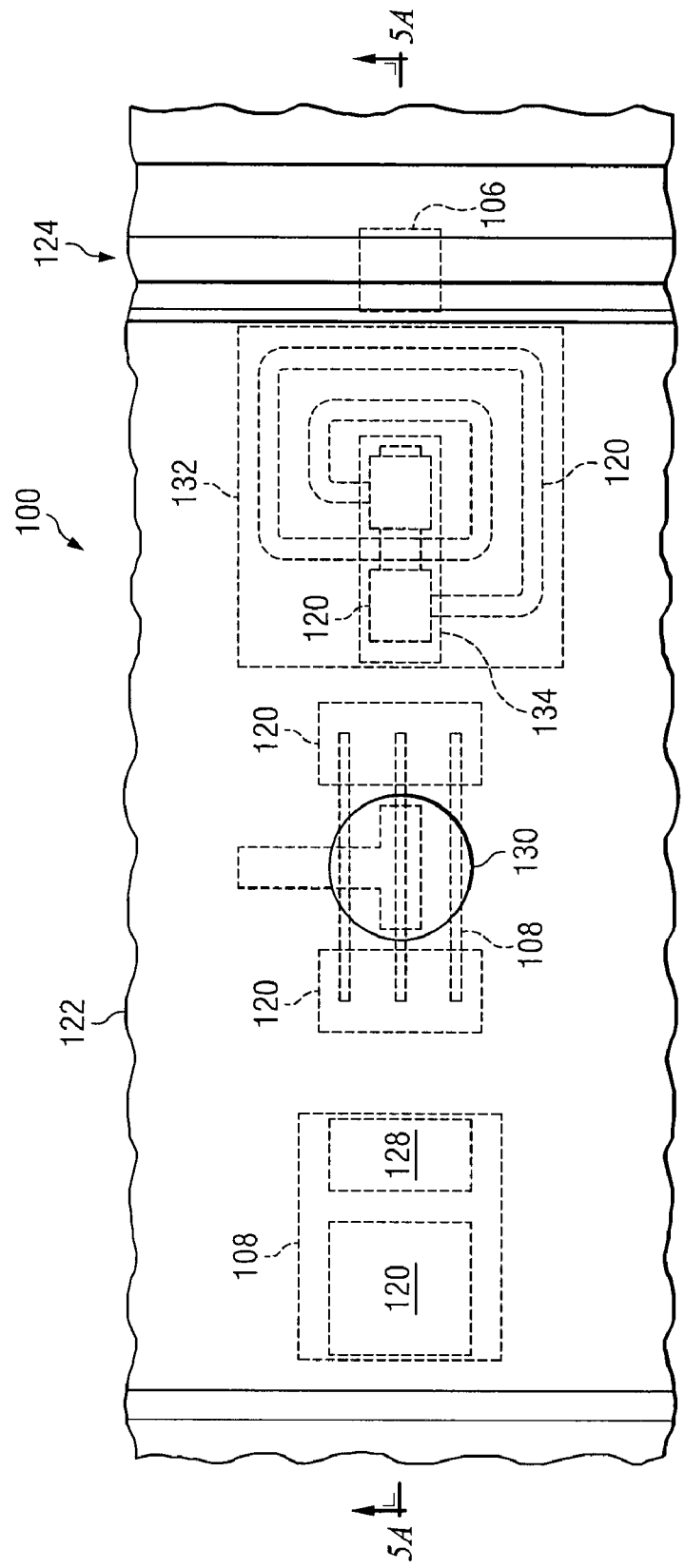
FIG. 5B illustrates a top view of an embodiment of a semiconductor device.

FIG. 5B illustrates a top view of a semiconductor device 100 as depicted in FIG. 5A. Again, such structures as bump 130, layers 122 and 120 are shown. The depicted passive spiral inductor device 132 includes a portion of metal layer 120 which has been patterned in a spiral shape. In the depicted embodiment, a nitride such as silicon nitride (SiN) is not found underneath the inductor device 132, except for the bridge portion 134, so as not to affect the performance of the inductor device 132.

Semiconductor devices 100 in the various embodiments shown can be manufactured using tools and equipment commonly known in the art, such as wire bonding, patterning, etching and similar equipment. Devices 100 serve to continue to advance integrated passive device technology at reduced fabrication cost, while resulting in larger overall repeatable quality.

While one or more embodiments of the present invention have been illustrated in detail, the skilled artisan will appreciate that modifications and adaptations to those embodiments may be made without departing from the scope of the present invention as set forth in the following claims.

What is claimed is:

1. A semiconductor device, comprising:
 a substrate;
 a first conductive layer formed over the substrate;
 a first insulating layer disposed over the substrate in contact with the first conductive layer;
 a second insulating layer disposed on a surface of the first insulating layer;
 a first opening formed through the second insulating layer to the surface of the first insulating layer;
 a second opening formed through the first and second insulating layers; and
 a second conductive layer disposed within the first opening over the surface of the first insulating layer and separated from the first conductive layer by the first insulating layer.

2. The semiconductor device of claim 1, wherein the second insulating layer includes a material other than a material included in the first insulating layer.

3. The semiconductor device of claim 1, further including a resistive layer disposed between the first conductive layer and first insulating layer with the second conductive layer, resistive layer, first insulating layer, and first conductive layer operating as a capacitor.

4. The semiconductor device of claim 1, further including an interconnect structure disposed over the second conductive layer and within the second opening.

5. The semiconductor device of claim 1, further including:
 a resistive layer disposed between the substrate and the first insulating layer; and
 an interconnect structure electrically connected to the resistive layer and disposed within the second opening.

6. A semiconductor device, comprising:
- a substrate;
- a first conductive layer formed over the substrate;
- a first insulating layer disposed over the substrate and first conductive layer;
- a second insulating layer disposed over a surface of the first insulating layer;
- a first opening formed in the second insulating layer; and
- a second conductive layer disposed within the first opening over the surface of the first insulating layer and separated from the first conductive layer by the first insulating layer.

7. The semiconductor device of claim 6, wherein the second insulating layer includes a material other than a material included in the first insulating layer.

8. The semiconductor device of claim 6, wherein the first conductive layer, first insulating layer, and second conductive layer operate as a capacitor.

9. The semiconductor device of claim 6, further including a resistive layer disposed between the first and second conductive layers.

10. The semiconductor device of claim 6, further including an interconnect structure formed over the second conductive layer.

11. The semiconductor device of claim 6, further including:
- a second opening formed through the second insulating layer; and
- a third opening formed in the first insulating layer through the second opening of the second insulating layer.

12. The semiconductor device of claim 6, further including a second opening formed through the first and second insulating layers.

13. A semiconductor device, comprising:
- a substrate;
- a first conductive layer formed over the substrate;
- a first insulating layer disposed over the substrate and first conductive layer;
- a second insulating layer disposed over a surface of the first insulating layer; and
- a second conductive layer formed over the second insulating layer and in contact with the surface of the first insulating layer and separated from the first conductive layer by the first insulating layer.

14. The semiconductor device of claim 13, wherein the second insulating layer includes a material other than a material included in the first insulating layer.

15. The semiconductor device of claim 13, wherein the first conductive layer, first insulating layer, and second conductive layer operate as a capacitor.

16. The semiconductor device of claim 13, further including an interconnect structure formed over and electrically connected to the second conductive layer.

17. The semiconductor device of claim 13, further including a resistive layer disposed between the first and second conductive layers.

18. The semiconductor device of claim 13, further including:
- a first opening formed through the second insulating layer; and
- a second opening formed in the first insulating layer through the first opening of the second insulating layer.

19. The semiconductor device of claim 13, further including an opening formed through the first and second insulating layers.

20. A semiconductor device, comprising:
- a substrate;
- a first conductive layer formed over the substrate;
- a first insulating layer formed over the substrate and first conductive layer;
- a second insulating layer formed over a surface of the first insulating layer; and
- a second conductive layer formed over the second insulating layer and extending through the second insulating layer to the surface of the first insulating layer.

21. The semiconductor device of claim 20, wherein the second insulating layer includes a material other than a material included in the first insulating layer.

22. The semiconductor device of claim 20, wherein the first conductive layer, first insulating layer, and second conductive layer operate as a capacitor.

23. The semiconductor device of claim 20, further including a resistive layer disposed between the first conductive layer and the second conductive layer.

24. The semiconductor device of claim 20, further including:
- a first opening formed through the second insulating layer; and
- a second opening formed in the first insulating layer through the first opening of the second insulating layer.

25. The semiconductor device of claim 20, further including an opening formed in the second insulating layer.

26. The semiconductor device of claim 20, further including an opening formed through the first and second insulating layers.

27. The semiconductor device of claim 20, further including:
- a third conductive layer disposed over the second conductive layer; and
- a third insulating layer formed over the third conductive layer and second insulating layer.

28. The semiconductor device of claim 6, further including:
- a third conductive layer disposed over the second conductive layer; and
- a third insulating layer formed over the third conductive layer and second insulating layer.

29. The semiconductor device of claim 13, further including an opening formed in the second insulating layer.

30. The semiconductor device of claim 13, further including:
- a third conductive layer disposed over the second conductive layer; and
- a third insulating layer formed over the third conductive layer and second insulating layer.

* * * * *